(12) United States Patent
Lin

(10) Patent No.: US 6,268,267 B1
(45) Date of Patent: Jul. 31, 2001

(54) SILICON-OXYNITRIDE-OXIDE (SXO) CONTINUITY FILM PAD TO RECESSED BIRD'S BEAK OF LOCOS

(75) Inventor: Shih-Chi Lin, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/488,588

(22) Filed: Jan. 24, 2000

(51) Int. Cl.⁷ .................................................. H01L 21/76
(52) U.S. Cl. ............................................. 438/439; 257/509
(58) Field of Search ..................................... 438/439, 297, 438/362, 448, 786; 257/506, 508, 509, 333, 647

(56) References Cited

U.S. PATENT DOCUMENTS

| | | | |
|---|---|---|---|
| 4,748,134 | * 5/1988 | Holland et al. | 437/62 |
| 4,762,728 | 8/1988 | Keyser et al. | 427/38 |
| 4,952,525 | * 8/1990 | van der Plas | 437/69 |
| 5,374,585 | 12/1994 | Smith et al. | 437/69 |
| 5,616,401 | * 4/1997 | Kobayashi et al. | 428/212 |

OTHER PUBLICATIONS

Wolf, "Silicon Processing for the VLSI Era", vol. 2: Process Integration, Lattice Press, Sunset Beach, CA, (1990), p. 17.

* cited by examiner

*Primary Examiner*—David Nelms
*Assistant Examiner*—Quoc Hoang
(74) *Attorney, Agent, or Firm*—George O. Saile; Stephen B. Ackerman

(57) ABSTRACT

A new method is provided for creating a LOCOS region in the surface of a semiconductor substrate. A layer of silicon-oxynitride-oxide (SXO) is deposited in a controlled manner over the surface of the substrate by controlling, during the process of deposition, the nitride and oxygen concentration of the layer of SXO as a function of the thickness of the deposited SXO. The silicon nitride is deposited over the layer of SXO. The two layers of SXO and silicon nitride are patterned and etched to define the active region, the field oxide is grown in the exposed regions of the silicon substrate. The created LOCOS region has a sharply reduced bird's beak profile while providing a good stress buffer for the overlying layer of silicon nitride.

5 Claims, 2 Drawing Sheets

SILICON-OXYNITRIDE-OXIDE (SXO) CONTINUITY FILM PAD TO RECESSED BIRD'S BEAK OF LOCOS

BACKGROUND OF THE INVENTION (1). Field of the Invention

The invention relates to the fabrication of integrated circuit devices, and more particularly, to a method of reducing the bird's beak in the field oxide region of active devices.

(2). Description of the Prior Art

Further miniaturization of semiconductor devices continues to result in further decreases of the dimensions of device features to the point where sub-micron device features are becoming common in the design of semiconductor devices. The active area of a semiconductor substrate typically contains many active devices or device features in close physical proximity to each other, these devices or device features must be electrically isolated from each other in order to function as independent entities. Among the most frequently used methods to achieve this electrical isolation are the Localized Oxidation Isolation (LOCOS) method, the poly-buffered LOCOS (PBLOCOS) and the Shallow Trench Isolation (STI) method.

STI techniques can use a variety of methods. For instance, one method is to form shallow trenches using Buried Oxide (BOX) isolation. The method involves filling the trenches with a chemical vapor deposition (CVD) silicon oxide ($SiO_2$), the silicon oxide is then etched back or mechanically/chemically polished to yield a planar surface. The shallow trenches that are etched for the BOX process are anisotropically plasma etched into the silicon substrate and are typically between 0.5 and 0.8 micrometer (um.) deep. STI's are formed around the active device to a depth between 4000 and 20000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of an insulating dielectric layer that acts to isolate the devices in a chip and thereby reduces the cross talk between the active devices. The excess deposited oxide is removed and the trench is planarized to prepare for the next level of metalization. The silicon nitride is provided to the silicon to prevent polishing of the masked silicon oxide of the device. This STI technique has the advantage of having no bird's beak (a problem experienced with the LOCOS technology) and no encroachment. Also, when two devices are separated by a trench, the electrical field lines have to travel a longer distance and change direction twice, so they are considerably weakened. Therefore, trenches in sub-micrometer dimensions are adequate for isolation to prevent punch-through and latch-up phenomena. Shallow-trench techniques however are complicated while in the past LOCOS and Poly-Buffered LOCOS (PBLOCOS) have provided satisfactory results. Shallow-trench techniques are therefore only slowly being used extensively in the industry.

The LOCOS process uses the characteristic of oxygen that oxygen diffuses through silicon nitride at a very slow rate. By covering silicon (of the substrate) with a layer of silicon nitride, no oxide can grow on the silicon surface. Since nitride oxidizes at a very low rate, the silicon nitride layer will form an oxidation barrier for an extended period of time. The deposition of the layer of silicon nitride is typically preceded by first forming a layer of silicon dioxide over the surface of the substrate. This $SiO_2$ layer forms a pad or buffer oxide and is used as a stress relieve between the silicon substrate and the overlying layer of silicon nitride. This because silicon nitride exhibits very high tensile stress when deposited over silicon. The active regions are defined and etched through the layers of $SiO_2$ (buffer oxide) and silicon nitride. Once the pattern has been defined and etched, the underlying silicon (substrate) can be implanted using $P^+$ or $N^+$ dopants thereby creating self-aligned (with the etched pattern) channel stop regions in the silicon substrate. It is generally desired to deposit a heavy layer of buffer oxide since this provides better protection to the underlying silicon substrate. A thick layer of buffer oxide however allows lateral oxidation to take place in the surface of the substrate by making the silicon nitride layer less effective as an oxidation mask. It is this lateral oxidation in the surface of the substrate that is referred to as bird's beak because this lateral oxidation, which takes place at both extremities of the openings of the created pattern, resembles the beak of a bird. The process of forming an insulating region proceeds by thermally growing the field oxide by wet oxidation (typically 450 to 850 nm thick, at a temperature of between about 550 and 950 degrees C. for a time of about 6 hours). After this process of growing the field oxide is completed, the layers of silicon nitride and buffer oxide can be removed.

The discipline of LOCOS isolation is extensively discussed in the literature of the art, for instance the publication Silicon Processing for the VLSI era, by S. Wolf, Lattice Press, Volume 2, Process Integration, chapter 2, pages 17 et al., provides detail on this subject.

It is clear that the phenomenon of the bird's beak is at cross-purposes with the design requirement of reducing device features since the bird's beak extends into the silicon substrate and thereby limits proximity of typical pattern openings. In the era of sub-micron device features, a typical bird's beak extends around about 0.5 um on each side of the pattern opening. Several schemes have been tried to reduce the size of the bird's beak, these schemes relate to selecting the relative thickness of the buffer oxide layer and the overlying layer of silicon nitride. It has been proposed to use materials other than oxide for the buffer layer, for instance a poly-buffered pad layer can be created for stress relieve. The invention addresses such a solution whereby a layer of silicon-oxynitride-oxide (SXO) is used to serve as buffer stress release layer while at the same time serving to shorten the typical bird's beak. For the prevention of the recessed bird's beak, SXO provides better results than SOON.

U.S. Pat. No. 5,616,401 (Kobayashi et al.) (cited by the inventor) shows a method comprising: form pad dielectric layer of oxynitride continuity film (SOON) using a $N_2O$, $SiH_4$ and $NH_3$ Plasma process, form SiN, pattern, form FOX. See Koyayashi FIGS. 1 to 3, spec. col. 7 & 8; see claims. Kobayshi has a preferred SOON method using CVD and $SiH_2Cl_2$, $NH_3$ and $N_2O$, see col. 7. But is not limited to that process. The inventor distinguishes the exact process of the invention over Kobayashi by pointing out that the structure of SOON (of Kobayashi) and SXO are converse structures, that is:

1) for SOON the silicon dioxide ($SiO_2$) composition is near the silicon substrate while the silicon nitride ($SiN_4$) is near the $Si_3N_4$ film. The sequence of layers for the SOON is therefore as follows: silicon (of the substrate) over which the layer of SOON (with the composition of $SiO_2$ followed by the $SiN_4$ as indicated ) over which the layer of $Si_3N_4$, and 2) for SXO is a silicon oxynitride-oxide film with the silicon oxynitride (SiON) composition near the silicon substrate and the silicon oxide ($SiO_2$) composition near the $Si_3N_4$ film. The sequence of layers for the SXO is therefore as follows: silicon (of the substrate) over which the layer of SXO (with the composition of SiON followed by the $SiO_2$ as indicated) over which the layer of $Si_3N_4$.

U.S. Pat. No. 5,374,585 (Smith et al.) shows a FOX process where the pad dielectric layer can be oxynitride. See col. 2, lines 60 to 65.

U.S. Pat. No. 4,762,728 (Keyser et al.) teaches a nitridation process.

SUMMARY OF THE INVENTION

A principle objective of the invention is to reduce the size of the bird's beak in creating device isolation regions without sacrificing stress relieve in the surface of the silicon substrate.

Another objective of the invention is to provide a stress relieve layer that is gradated in its chemical composition whereby the lower region of the layer essentially contains silicon-oxynitride while the upper region of the layer essentially contains silicon dioxide.

Yet another objective of the invention is to provide a method whereby the control of the concentration of silicon-oxynitride in the lower region of the stress relieve layer and the concentration of the silicon dioxide in the upper region of the layer controls the size of the bird's beak.

A still further objective of the invention is to provide a method of creating a stress relieve layer that by the gradation of its chemical composition provides good oxidation protection to the surface of the silicon substrate.

A still further objective of the invention is to provide a method of creating a bird's beak using the LOCOS process that is reduced in size to between 0 and 0.35 um.

In accordance with the objectives of the invention a new method is provided for creating a LOCOS region in the surface of a semiconductor substrate. A layer of silicon-oxynitride (SXO) is deposited in a controlled manner over the surface of the substrate by controlling, during the process of deposition, the nitride and oxygen concentration of the layer of SXO as a function of the thickness of the deposited SXO. The silicon nitride is deposited over the layer of SXO. The two layers of SXO and silicon nitride are patterned and etched to define the active region, the field oxide is grown in the exposed regions of the silicon substrate. The created LOCOS region has a sharply reduced bird's beak profile while providing a good stress buffer for the overlying layer of silicon nitride.

DESCRIPTION OF THE PREFERRED EMBODIMENTS

Figure 1:
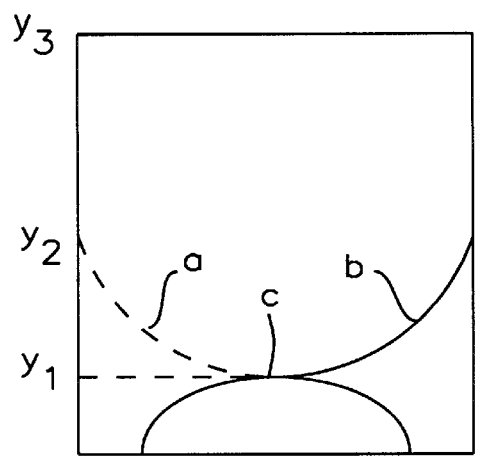
FIG. 1 shows the desired distribution of the relative concentration of nitrogen and oxygen in the deposited layer of SXO.

FIG. 1 addresses the growing of the buffer layer 12, which is critically important to the invention and is detailed as follows. The two curves that are presented in FIG. 1 show the concentration of nitrogen (curve a) and oxygen (curve b) as a function of increased thickness of the layer of SXO. The thickness of the layer of SXO is plotted along the Y-axis, by drawing for a given thickness Y of the layer of SXO a line that is parallel to the X-axis and by observing the X-value of the intersects with the two curves shown in FIG. 1, the relative concentration of nitride (curve a) and oxide (curve b) for that layer can be derived. These curves show that, for instance, where the layer of SXO is very thin (a very small value for Y), the layer contains a higher concentration of nitride and a lower concentration of oxide. With an increase in the thickness of the layer of SXO, the nitride starts to decrease while the concentration of oxygen starts to increase. At a thickness $Y_1$ of the layer of SXO that corresponds with the crossover point c, the concentration of nitride is the same as the concentration of oxide. For values of thickness Y of the layer of SXO that go above this (cut-off) point c, the concentration of oxide further increases while the concentration of nitride further decreases. At point $Y_2$ the concentration of oxide has reached its highest point while the concentration of nitride has decreased to zero. Point $Y_3$ in FIG. 1 represents the total thickness of the layer of SXO; this is about 350 Angstrom.

The surface of the substrate is exposed to a mixture of gasses, that is $SiH_4$, $N_2O$ and $NH_3$. The chemical reaction of these gasses is: $SiH_4+N_2O+NH_3 \rightarrow SiON$, this reaction takes place using either Low Pressure CVD (LPCVD) or Plasma Enhanced CVD (PECVD) techniques for the deposition of the $SiH_4+N_2O+NH_3$ on the surface of the substrate. The process of deposition of the buffer layer is controlled such that an initial layer of SiON is created on the surface of substrate 10, this layer is to be between about 75 and 200 Angstrom thick. The profile of the distribution of the oxygen and nitrogen within the layer of SXO has already been highlighted as shown in FIG. 1. During the first phase of the creation of the layer of SXO, the mixture of $N_2O$ and $NH_3$ is adjusted such that a layer of SiON is created, this to a thickness of about 75 to 200 Angstrom. It has already been indicated that, as the thickness of the buffer layer increases, the oxygen content of the layer will be increased while the nitride content of the buffer layer will be decreased. This is accomplished by increasing the concentration of $N_2O$ and decreasing the concentration of $NH_3$ in the mixture of $SiH_4+N_2O+NH_3$. This process of increasing ($N_2O$) and decreasing ($NH_3$) is continued for a deposition of the layer of SXO of between about 50 and 100 Angstrom of this layer. After this (sub-) layer of the buffer layer has been created, the $NH_3$ flow is completely eliminated and the remainder of the buffer layer is create by depositing only $SiH_4$ and $N_2O$.

During the initial deposition of the 75–200 Angstrom thickness layer, the temperature is between 750 and 800 degrees C. for the LPCVD process or between 320 and 410 degrees C. the PECVD process with a pressure of between about 250 and 450 mTorr for the LPCVD process and between about 860 and 1000 mTorr for the PECVD process. The mixture rate for the three gasses that are used during this first phase of the process are given following as an example for the PECVD process and are as follows: $SiH_4$ about 7.7%, $N_2O$ about 47.3% and $NH_3$ about 45%.

During the second phase of the process, that is the deposition of the between about 50 and 100 Angstrom thick layer, the gas flow only is adjusted while the other parameters remain the same.

The mixture rate for the three gasses that are used during the third phase of the process are given following as an example for the PECVD process and are as follows: $SiH_4$ about 2.6%, $N_2O$ about 97.4% and $NH_3$ 0%. During this final stage of the deposition, all other parameters remain the same as during the prior stages of deposition.

By following the above indicated procedure, the buffer layer between the thickness of 0 and $Y_1$ essentially contains SiON, from $Y_1$ to $Y_2$ the layer slowly changes from SiON to $SiO_x$ where between the thickness Of $Y_2$ and $Y_3$ the buffer layer contains $SiO_x$ only.

Figure 2:
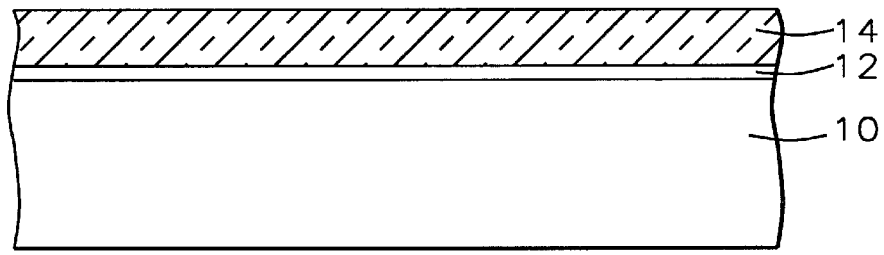
FIG. 2 shows a cross section of a silicon substrate with buffer layer and oxidation protection layer deposited thereon.

Referring now specifically to FIG. 2, there is shown a cross section of a silicon substrate 10 with the above discussed buffer layer 12 of SXO and the oxidation protection layer 14 of silicon nitride deposited over the layer 12 of SXO. The creation of the buffer layer 12 has already been detailed above under FIG. 1. The layer 14 of silicon nitride is typically deposited to a thickness of about 150 nm using CVD technology.

Figure 3:
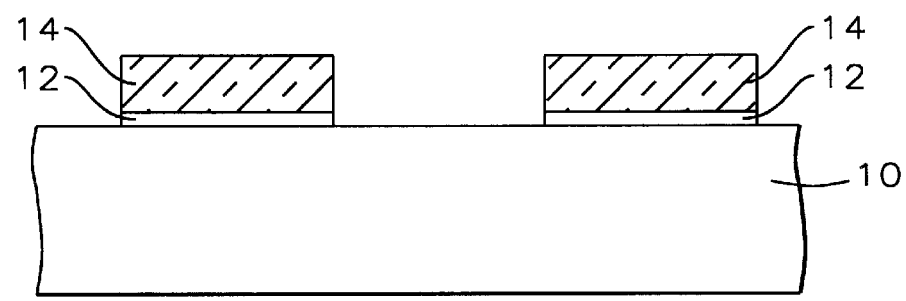
FIG. 3 shows a cross section of the silicon substrate after patterning and etching of the buffer layer and the oxidation protection layer.

FIG. 3 shows a cross section of the silicon substrate after patterning and etching of the buffer layer 12 and the oxidation protection layer 14. The active regions are defined with a photolithographic step so that they are protected by a layer of patterned photoresist, the composite SXO/nitride layers are then dry etched as a stack.

Figure 4:
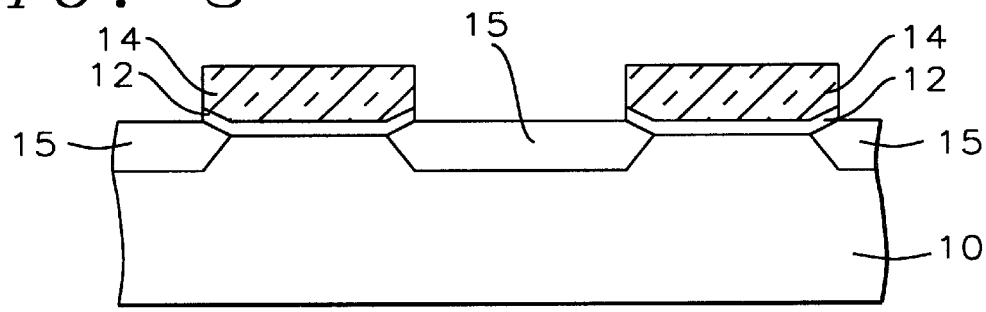
FIG. 4 shows a cross section of a silicon substrate after wet oxidation of the substrate surface.

FIG. 4 shows a cross section of a silicon substrate after wet oxidation of the substrate surface. This process of wet oxidation is typically performed at a temperature of between about 900 and 1000 degrees C. for between about 4 and 8 hours thereby creating a layer 15 of field oxide that is between about 500 and 900 nm thick.

Figure 5:
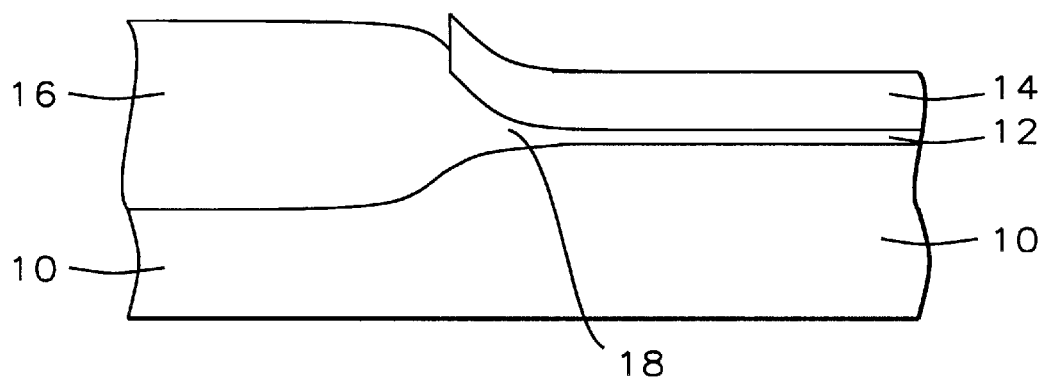
FIG. 5 shows a cross section of the field oxide with a typical bird's beak formation.
Figure 6:
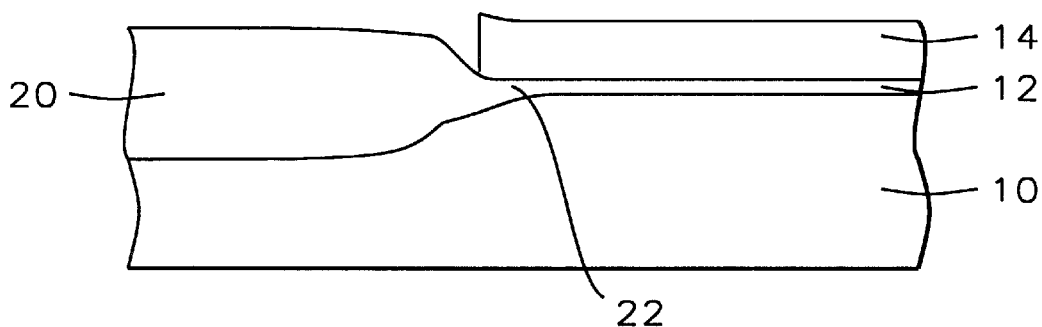
FIG. 6 shows a first cross section of the field oxide with a bird's beak formation under conditions of the invention.
Figure 7:
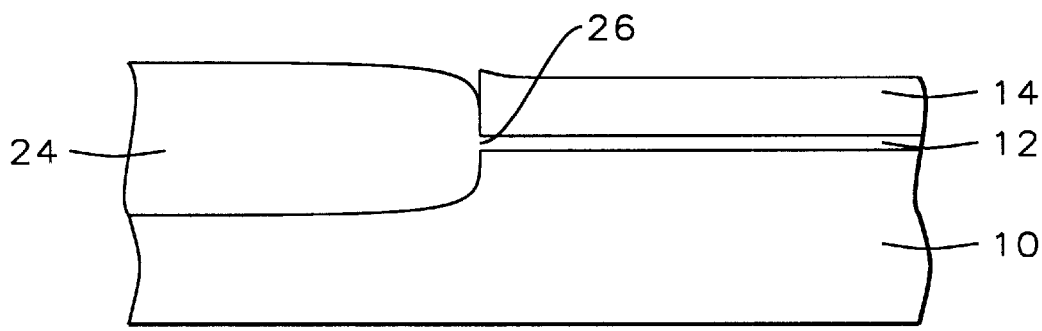
FIG. 7 shows a second cross section of the field oxide with a bird's beak formation under conditions of the invention.

FIGS. 5 through 7 show experimental results that have been obtained under the invention.

FIG. 5 is a cross section o f a typical field oxide region with the formation of the familiar bird's beak. This FIG. 5 has been made part of the presentation of the invention in order to facilitate comparison of the results of the invention with typical processing results. On the surface of the silicon substrate 10 a buffer layer 12 of oxide has been grown over which a layer 14 of silicon nitride has been deposited. The filed oxide region 16 is created as previously highlighted; the formation of the bird's beak 18 is clearly visible.

FIG. 6 shows a cross section of a field oxide region under the invention using a layer 12 of SXO as the buffer layer over which layer 14 of silicon nitride is deposited. It is clear from FIG. 6 that the formation of the bird's beak 22 has been sharply reduced, especially when comparing the penetration of region 18 in FIG. 5 with the penetration of region 22 of FIG. 6. For the experimental cross section that is shown in FIG. 6, the SiON layer that has been grown as part of the buffer layer of SXO (that is the initial sub-layer of the layer of SXO that is in contact with the silicon surface) has been grown to a thickness of about 100 Angstrom.

FIG. 7 further emphasizes this point of reduction of the bird's beak of the field oxide region. For the experimental results that are shown in FIG. 7, the SiON layer that has been grown as part of the buffer layer of SXO has been grown to a thickness of about 150 to 200 Angstrom. The field oxide region 24 shows a bird's beak 26 that in essence has ceased to exist and that has been eliminated under the process of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a Localized Oxidation Isolation (LOCOS) region, comprising the steps of:

providing a silicon substrate;

depositing a layer of silicon-oxynitride-oxide (SXO) over the surface of said substrate by exposing the surface of said substrate is to a mixture of $SiH_4$, $N_2O$ and $NH_3$ using either Low Pressure CVD (LPCVD) or Plasma Enhanced CVD (PECVD) techniques, thereby creating an initial layer of SiON on the surface of said substrate said initial layer is to be between about 75 and 200 Angstrom thick, by then decreasing the nitrogen concentration while increasing the oxygen concentration in said mixture of $SiH_4$, $N_2O$ and $NH_3$ by adjusting the mixture of $N_2O$ and $NH_3$ by decreasing the concentration of $NH_3$ while increasing the concentration of $N_2O$ in said mixture of $SiH_4+N_2O+NH_3$ thereby creating a modified mixture of $SiH_4$, $N_2O$ and $NH_3$ said increasing and decreasing to continue for a deposition of the layer of SXO of between about 50 and 100 Angstrom thick, by then eliminating the $NH_3$ flow from said modified mixture of $SiH_4+N_2O+NH_3$ and completing said deposition of said layer of silicon-oxynitride-oxide (SXO) to an overall thickness of between about 200 and 500 Angstrom;

depositing a layer of silicon nitride over said layer of SXO;

defining active regions for said silicon substrate thereby by inclusion defining the LOCOS regions for said silicon substrate; and performing wet oxidation of said LOCOS regions.

2. The method of claim 1 wherein said depositing a layer of silicon nitride is depositing a layer of $Si_3N_4$ using LPCVD or PECVD procedures, at a temperature between about 200 and 800 degrees C. to a thickness between about 150 and 300 nm.

3. The method of claim 1 wherein said defining the active regions for said silicon substrate is exposing and etching said silicon nitride film thereby creating openings within said silicon nitride and said layer of SXO that are above and mate with said patterned areas within said silicon substrate wherein field oxide regions are to be formed.

4. The method of claim 1 wherein said performing wet oxidation of said LOCOS regions is selectively depositing silicon dioxide in said LOCOS regions and growing field oxide with a thickness of 500 to 900 nm. by wet oxidation of said surface of said silicon dioxide at temperatures of 900 to 1000 degrees C. for 4 to 8 hours.

5. A method for forming a Localized Oxidation Isolation (LOCOS) region, comprising the steps of:

providing a silicon substrate;

exposing the surface of said substrate is to a mixture of $SiH_4$, $N_2O$ and $NH_3$ using either Low Pressure CVD (LPCVD) or Plasma Enhanced CVD (PECVD) techniques thereby creating an initial layer of SiON on the surface of said substrate said initial layer is to be between about 75 and 200 Angstrom thick;

continue exposing the surface of said substrate is to said mixture of $SiH_4$, $N_2O$ and $NH_3$ while decreasing the nitrogen concentration by decreasing the concentration of $NH_3$ and increasing the oxygen concentration by increasing the concentration of $N_2O$ thereby forming and modified mixture of $SiH_4$, $N_2O$ and $NH_3$ said increasing and decreasing to continue for a deposition of the layer of SXO of between about 50 and 100 Angstrom thick; and eliminating the $NH_3$ flow from said modified mixture of $SiH_4+N_2O+NH_3$ and completing said deposition of said layer of silicon-oxynitride-oxide (SXO) to an overall thickness of between about 200 and 500 Angstrom;

depositing a layer of silicon nitride over said layer of SXO;

defining the active regions for said silicon substrate thereby by inclusion defining the LOCOS regions for said silicon substrate; and performing wet oxidation of said LOCOS regions.

\* \* \* \* \*